United States Patent
Kodihalli et al.

(10) Patent No.: US 6,822,439 B2
(45) Date of Patent: Nov. 23, 2004

(54) CONTROL OF TRISTATE BUSES DURING SCAN TEST

(75) Inventors: Himakiran Kodihalli, Bangalore (IN); Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/608,356

(22) Filed: Jun. 27, 2003

(65) Prior Publication Data

US 2004/0153929 A1 Aug. 5, 2004

Related U.S. Application Data

(60) Provisional application No. 60/443,769, filed on Jan. 30, 2003.

(51) Int. Cl.$^7$ ................................................ G01R 31/26
(52) U.S. Cl. ...................... 324/158.1; 324/765; 714/726
(58) Field of Search .............................. 324/158.1, 765, 324/763; 714/726, 727, 728, 729, 730, 731

(56) References Cited

U.S. PATENT DOCUMENTS

| | | | | |
|---|---|---|---|---|
| 5,214,655 A | * | 5/1993 | Eichelberger et al. | 714/733 |
| 5,812,561 A | * | 9/1998 | Giles et al. | 714/726 |
| 6,487,688 B1 | * | 11/2002 | Nadeau-Dostie | 714/726 |
| 6,543,018 B1 | * | 4/2003 | Adusumilli et al. | 714/729 |

* cited by examiner

*Primary Examiner*—Evan Pert
*Assistant Examiner*—Tung X. Nguyen
(74) *Attorney, Agent, or Firm*—McAndrews, Held & Malloy, Ltd.

(57) ABSTRACT

A system, method, and apparatus for controlling tri-state drivers are presented herein. During scan testing, a decoder controls the tri-state drivers and prevents more than one tri-state driver from driving a shared resource, regardless of the test patterns shifted into the scan chain. During functional mode, the tri-state drivers are driven by functional enables.

22 Claims, 4 Drawing Sheets

CONTROL OF TRISTATE BUSES DURING SCAN TEST

RELATED APPLICATIONS

This application claims priority to Provisional Application for U.S. Pat. Ser. No. 60/443,769, "Control of Tristate Buses During Scan-Test—A Strategy" by Kodihalli, et. al., filed Jan. 30, 2003.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Due to the increasing numbers of transistors that are incorporated on integrated circuits, exhaustive testing of integrated circuits is practically impossible. Rather, digital circuits are usually tested by applying a variety of test signals to the system and monitoring the output signals produced in response.

Adding to this technique, digital circuits have also been designed with memory stages which can be operated in one of two modes—a first mode where the memory stages operate primarily as designed, and a second mode where the memory stages are connected in series to form one or more extended shift registers, otherwise known as scan chains. During the second mode, bit patterns, known as test vectors, are shifted or scanned into the scan chains. The logic system is returned to its first mode configuration and permitted to operate for one clock. The logic system is then returned to the second mode and the results extracted from the logic system (again by scanning) are analyzed to determine the operability of the stages and interconnections of the logic system. This testing technique is usually referred to as "scan testing".

Fault coverage measures the degree to which test vectors are capable of uncovering potential defects and faults. It is a goal of scan testing to achieve a high degree of fault coverage in a reasonable amount of time. Accordingly, there are a number of tools which generate a combination of test patterns which achieve a requisite degree of fault coverage in short amount of time.

Many of the digital circuits tested include tristate buses, which can be used by two or more entities. Competing requests for use by the two or more entities result in a resource contention. Use of test patterns which cause resource contention on tristate buses result in erroneous error reporting. Accordingly, automatic test pattern generators remove test patterns which cause resource contention on tristate buses and replace the test patterns with other test patterns which achieve the same fault coverage and avoid the resource contention. Nevertheless, some fault coverage is still lost.

Further limitations and disadvantages of conventional and traditional approaches will become apparent to one of skill in the art through comparison of such systems with embodiments presented in the remainder of the present application with reference to the drawings.

BRIEF SUMMARY OF THE INVENTION

Described herein are system(s), method(s), and apparatus for controlling tristate buses during scan testing. In one embodiment, there is presented a method for testing a circuit. The method for testing the circuit includes serially shifting a test pattern into at least a portion of the circuit. While serially shifting the test pattern, each of a plurality of tristate drivers except a default driver from the plurality of tristate drivers are disabled. The method also includes capturing a test response from at least a portion of the circuit. While capturing the test response from the portion of the circuit, each of the plurality of tristate drivers except a selected one of the plurality of drivers are disabled.

In another embodiment, there is described a system for testing a circuit. The system includes scan line registers, and a decoder. The scan line registers are for shifting a test pattern into at least a portion of the circuit and capturing a test response from at least a portion of the circuit. The decoder is for disabling each of a plurality of tristate drivers except a default driver from the plurality of tristate drivers while the scan line registers serially shift the test pattern, and disabling each of the plurality of tristate drivers except a selected one of the plurality of drivers while the scan line registers capture the test response.

In another embodiment, there is presented a circuit for testing a device under test. The circuit includes scan line registers and a decoder. The scan line registers shift a test pattern into at least a portion of the device under test and capturing a test response from at least a portion of the circuit. The decoder is connected to the scan line registers and disabling each of a plurality of tristate drivers except a default driver from the plurality of tristate drivers while the scan line registers serially shift the test pattern, and disables each of the plurality of tristate drivers except a selected one of the plurality of drivers while the scan line registers capture the test response.

These and other advantages and novel features of the present invention, as well as details of illustrated embodiments thereof, will be more fully understood from the following description and drawings.

DETAILED DESCRIPTION OF THE INVENTION

Figure 1:
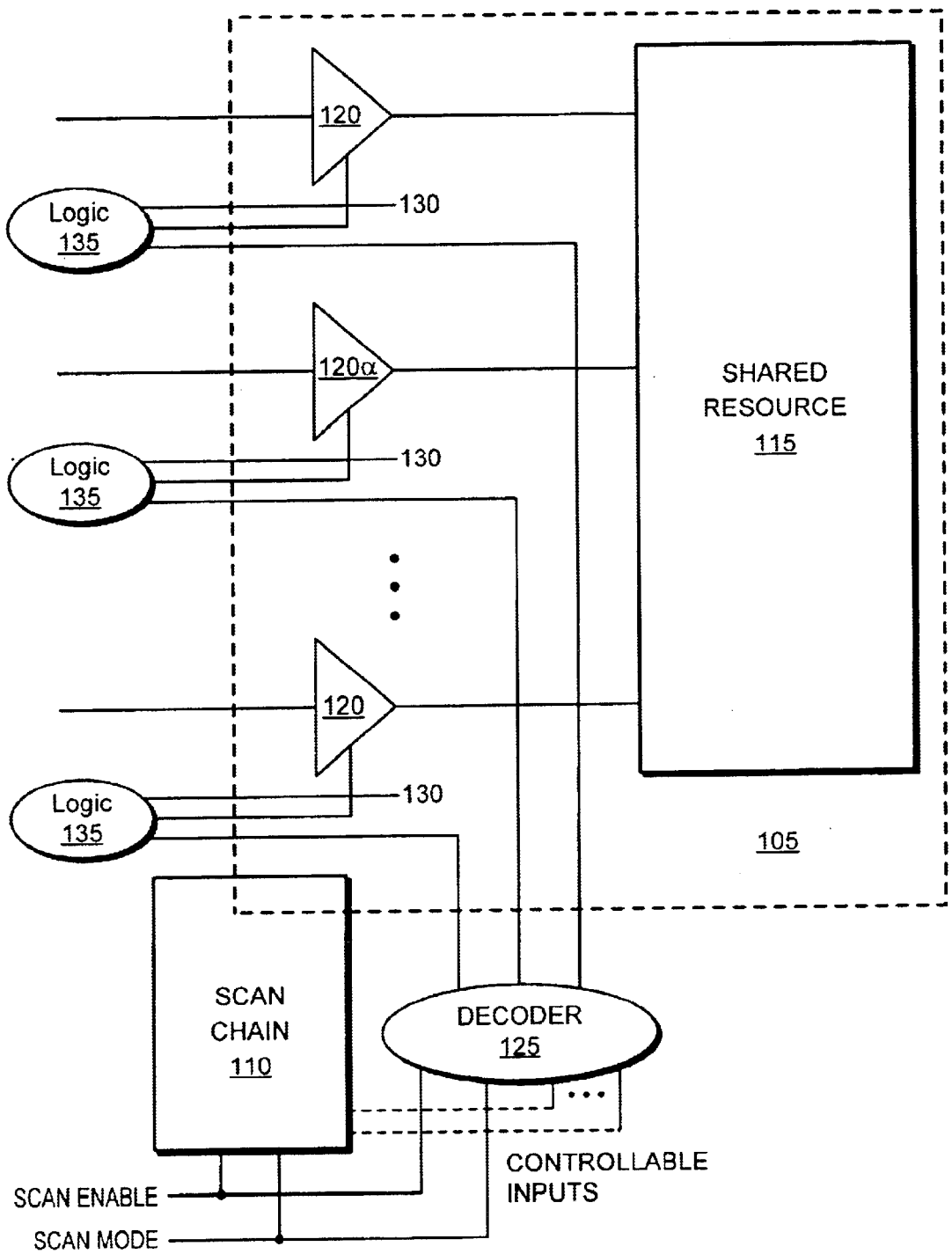
FIG. 1 is a block diagram describing a system for testing a circuit in accordance with an embodiment of the present invention.

Referring now to FIG. 1, there is illustrated a circuit 100 in accordance with an embodiment of the present invention. The circuit 100 comprises a functional portion 105, also known as a sea of logic, and additional testing hardware. The circuit 100 can be implemented in a number of ways, such as an integrated circuit on a chip or a printed circuit on a printed circuit board.

The circuit 100 can operate in either a functional mode or a scan mode. The functional mode is the primary function of operation for the circuit 100. The functional portion 105 is the portion of the circuit that performs the primary functions.

For example, the circuit 100 can be incorporated into an end product. In general, the functional portion 105 is the portion of the circuit 100 that performs the chip functions after incorporation into the end product. The circuit 100 also includes additional elements that are used for testing functions.

The scan mode is a testing mode to verify proper operation of the functional portion 105. During the scan mode, state devices, such as flip-flops, are connected in series to form one or more extended shift registers, otherwise known as scan chains 110. During the second mode, bit patterns, known as test vectors, are shifted or scanned into the scan chains 110. After scanning the test vectors into the scan chains 110, the functional portion 105 of the circuit 100 operates as though in the functional mode for one cycle. After the cycle, the contents of the scan chain 110 are extracted. The foregoing can be repeated any number of times.

The circuit 100 also includes shared resources 115, such as a bus, that can be used by two or more entities. Each of the entities accesses the bus through a tri-state driver 120. The tri-state drivers 120 can operate in one of three states—a high impedance state, a high state, and a low state. When a tri-state driver 120 is in the high impedance state, the tri-state driver 120 does not attempt to set the shared resource 115 into any state. When the tri-state drivers 120 are in either the high state or the low state, the tri-state drivers 120 attempt to drive the shared resource into the high or low state.

A resource contention occurs when two or more tri-state drivers 120 attempt to drive the shared resource 115. Serious damage to the circuit 100 can occur when two or more tri-state drivers 120 attempt to drive the shared resource 115 to two different states. Another problem occurs when none of the tri-state drivers 120 attempt to drive the share resource 115. The foregoing can cause the shared resource 120 to enter a floating state. The foregoing problems are alleviated during the functional mode by an arbiter that prevents resource contentions.

During testing mode, the test patterns that are scanned into the scan chain 110 can potentially cause resource contentions with the shared resource 115. To prevent resource contentions, a decoder 125 and logic circuits 130 are connected to each of the tri-state drivers 120 that can potentially drive a shared resource 115.

The scan mode is indicated by the assertion of the scan_mode signal. The decoder 125 receives the scan_mode signal, and upon receiving the scan mode signal, the decoder disables (e.g., sets to a high impedance state) all but one of the tri-state drivers 120. As noted above, during the scan mode, test patterns are serially shifted through the scan chain 110. The shifting is indicated by assertion of the scan_enable signal. While the bits are shifted through the scan chain 110, the decoder 125 disables all of the tri-state drivers 120, except for one default driver 120d. The foregoing prevents resource contention.

After the serial bit shift, the functional portion 105 operates as though in the functional mode for one clock cycle. During the one clock cycle, the decoder 125 disables each of the tri-state drivers 120 except one. The one tri-state driver 120 that is not disabled is controllable by controllable input signals. For example, in one embodiment, the selected state driver 120 can be a function of the test pattern. Additionally, the selected state driver 120 can be selected by receiving the controllable input signals from the scan chain 110.

During the functional mode, the decoder 125 does not disable any of the tri-state drivers 120. The tri-state drivers 120 are controlled by functional enable signals 130 from the functional portion 105 of the circuit 100. The tri-state drivers 120 are controlled by logic circuits 135 that are connected thereto. The logic circuits 135 receive a signal from the decoder 125 and functional enable signals 130 from the functional portions 105 of the circuit 100. During the functional mode, the decoder 125 transmits signals to the logic circuits 135 that cause the output of the logic circuits 135 to be determined by the functional enables 130.

Figure 2:
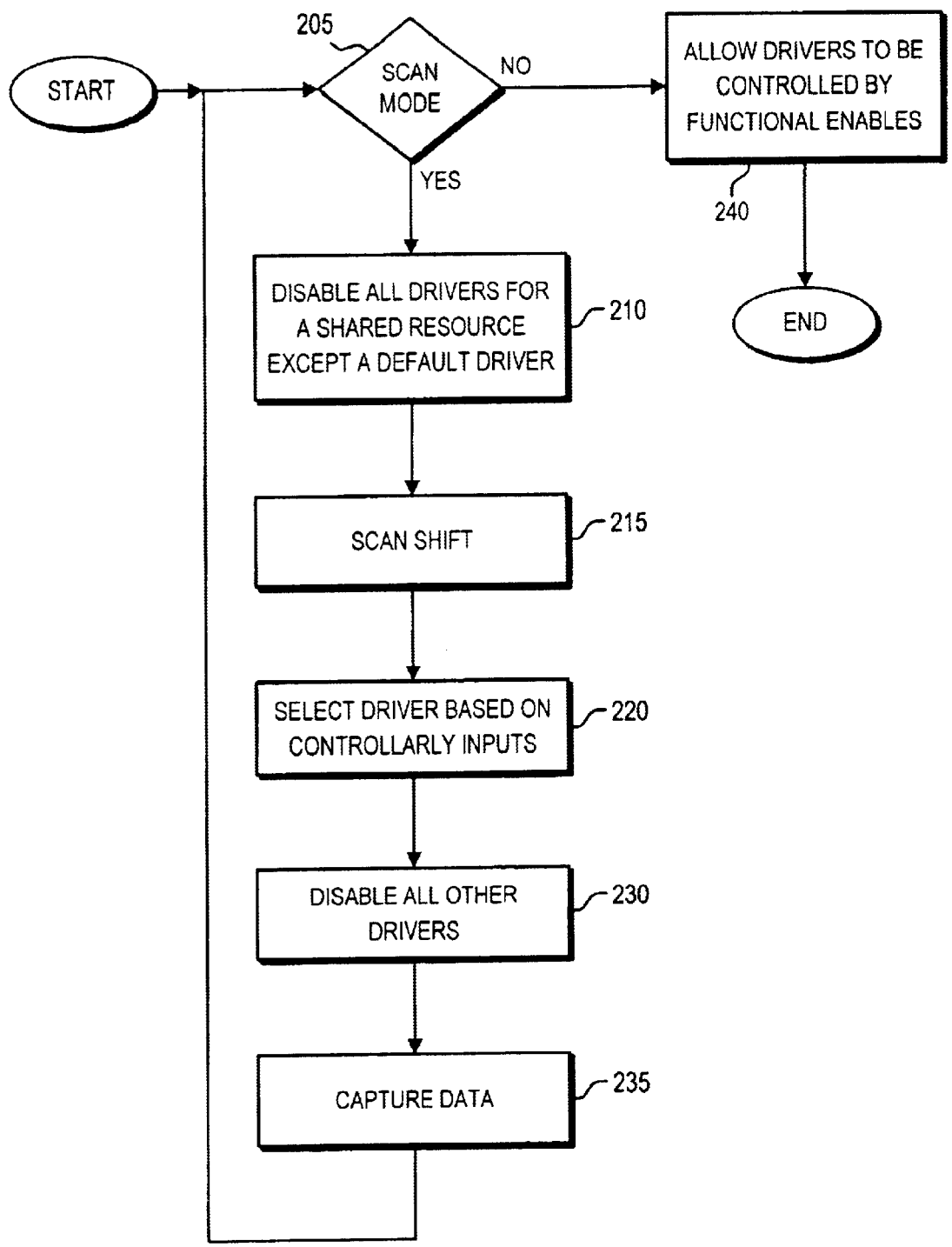
FIG. 2 is a flow diagram for testing a circuit in accordance with an embodiment of the present invention.

Referring now to FIG. 2, there is illustrated a flow diagram for testing a circuit in accordance with an embodiment of the present invention. At 205, a determination is made whether the circuit 100 is operating in the scan mode or functional mode. As noted above, the mode of operation may be indicated by assertion of the scan_mode signal. If the circuit 100 is not operating in scan mode, the circuit is operating in the functional mode. Accordingly, at 240, the tri-state drivers 120 are controlled by functional enables 130. The decoder 125 can allow the tri-state drivers 120 to be controlled by the functional enables 130 by either not transmitting any signal, or alternatively, transmitting a signal to the logic circuits 135, such that the output of the logic circuit 135 is determined by the functional enables 130.

If at 205, the circuit 100 is in the scan mode, all of the tri-state drivers 120 except for a default tri-state driver 120d for a shared resource 115 are disabled (210) during scan shifting (215). The decoder 125 disables the tri-state drivers 120 transmitting of a signal to the logic circuits 130 controlling each of the tri-state drivers 120 except the default tri-state driver 120d, causing the tri-state drivers 120 to be disabled. As noted above, the scan shifting is indicated by assertion of the scan_enable signal.

At 220, after the scan shift, a tri-state driver 120 is selected based on the controllable inputs. The selected tri-state driver 120 can be a function of the test pattern shifted into the scan chain 110. As well, the controllable inputs can be received from the scan chain 110, itself.

At 230, each of the tri-state drivers 120 except for the selected tri-state driver 120 are disabled while data is captured (235). After the data is captured during 235, 205–240 are repeated.

Figure 3:
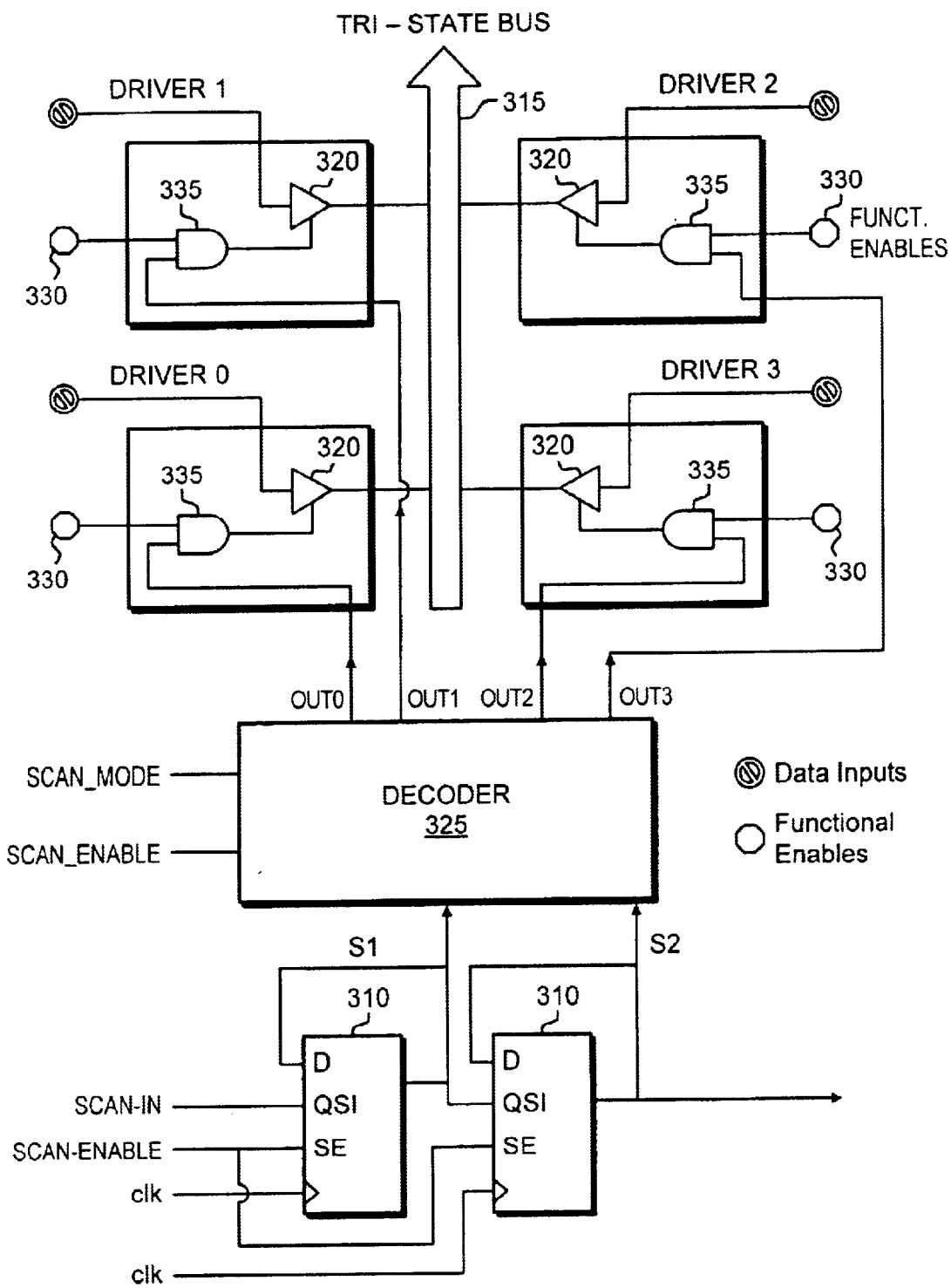
FIG. 3 is a block diagram of a circuit for testing a device under test in accordance with an embodiment of the present invention.

Referring now to FIG. 3, there is illustrated a block diagram describing a system for testing a circuit in accordance with an embodiment of the present invention. The circuit 300. The circuit 300 also includes a bus 315 that is shared by two or more entities. Each of the entities accesses the bus through a tri-state driver 320. A resource contention may occur when two or more tri-state drivers 320 attempt to drive the bus 315. Serious damage to the circuit 300 can occur when two or more tri-state drivers 320 attempt to drive the bus 315 to two different states. Another problem may occur when none of the tri-state drivers 120 attempt to drive the bus 315. The foregoing can cause the bus 315 to enter a floating state. An arbiter that prevents resource contentions may alleviate the foregoing problems during the functional mode.

During testing mode, the test patterns that are scanned into the scan chain 310 can potentially cause resource contentions with the bus 315. To prevent resource contentions, a decoder 325 and AND gates 335 are connected to each of the tri-state drivers 320 that can potentially drive the bus 315.

The scan mode is indicated by the assertion of the scan_mode signal. The decoder 325 receives the scan_mode signal, and upon receiving the scan mode signal, the decoder disables (e.g., sets to a high impedance state) all but one of the tri-state drivers 320. As noted above, during the scan mode, test patterns are serially shifted through the scan chain 310. The shifting is indicated by assertion of the scan_enable signal. While the bits are shifted through the scan chain 310, the decoder 325 disables all of the tri-state drivers 320, except for one default driver 320d. The foregoing prevents resource contention.

After the serial bit shift, the circuit 300 operates as though in the functional mode for one clock cycle. During the one clock cycle, the decoder 325 disables each of the tri-state drivers 320 except one. The one tri-state driver 320 that is not disabled is controllable by controllable input signals from two particular flip-flops 322 in the scan chain 310.

The tri-state drivers 320 are controlled by functional enable signals 335. The tri-state drivers 320 are connected to AND gates 335. The AND gates 335 receive a signal from the decoder 325 and functional enable signals 330. The decoder 325 disables a particular tri-state driver 325 by transmitting a logical "0" to the AND gate 335 connected to the tri-state driver 320.

During the functional mode, the decoder 325 transmits a logical "1" to each of the AND gates 335 connected to the tri-state drivers 320. The logical "1's" transmitted by the decoder 325 cause the output of the AND gates 335 to be determined by the functional enables 330.

Additionally, in one embodiment, the decoder 325 can also include an IDDQ_enable signal that causes all of the drivers except the default driver 320d to be disabled.

The decoder 325 can be implemented in a number of different ways. For example, the decoder 325 can be implemented by programmable hardware that executes instructions from a memory. Storage of the instructions in the memory physically, chemically, and/or electromagnetically alters the memory.

In an exemplary case, the plurality of instructions can include the follow instructions:

```
If (iddq_enable) OUT0 = 1;
else If (scan_test_mode) {
        If(scan_enable) {  OUT 0=1; (DRIVER0 active)
                           OUT1= 0; (DRIVER1 inactive)
                           OUT2 = 0; (DRIVER2 inactive)
                           OUT3 = 0; (DRIVER3 inactive)
                        }
        else Active output is selected by S1, S2;
    else OUT0, OUT1, OUT2, OUT3 = '1' ; (Functional enables
                                will decide the
                                active driver )
```

Alternatively, the decoder 325 can be implemented as logic. In an exemplary case, the logic design of the decoder 325 can adhere to the following truth table describing the input/output behavior:

| Scan_Mode | Scan_enable | S1 | S2 | O0 | O1 | O2 | O3 |
|---|---|---|---|---|---|---|---|
| 0 | X | X | X | 1 | 1 | 1 | 1 |
| 1 | 0 | 0 | 0 | 1 | 0 | 0 | 0 |
| 1 | 0 | 0 | 1 | 0 | 1 | 0 | 0 |
| 1 | 0 | 1 | 0 | 0 | 0 | 1 | 0 |
| 1 | 0 | 1 | 1 | 0 | 0 | 0 | 1 |
| 1 | 1 | X | X | 1 | 0 | 0 | 0 |

Figure 4:
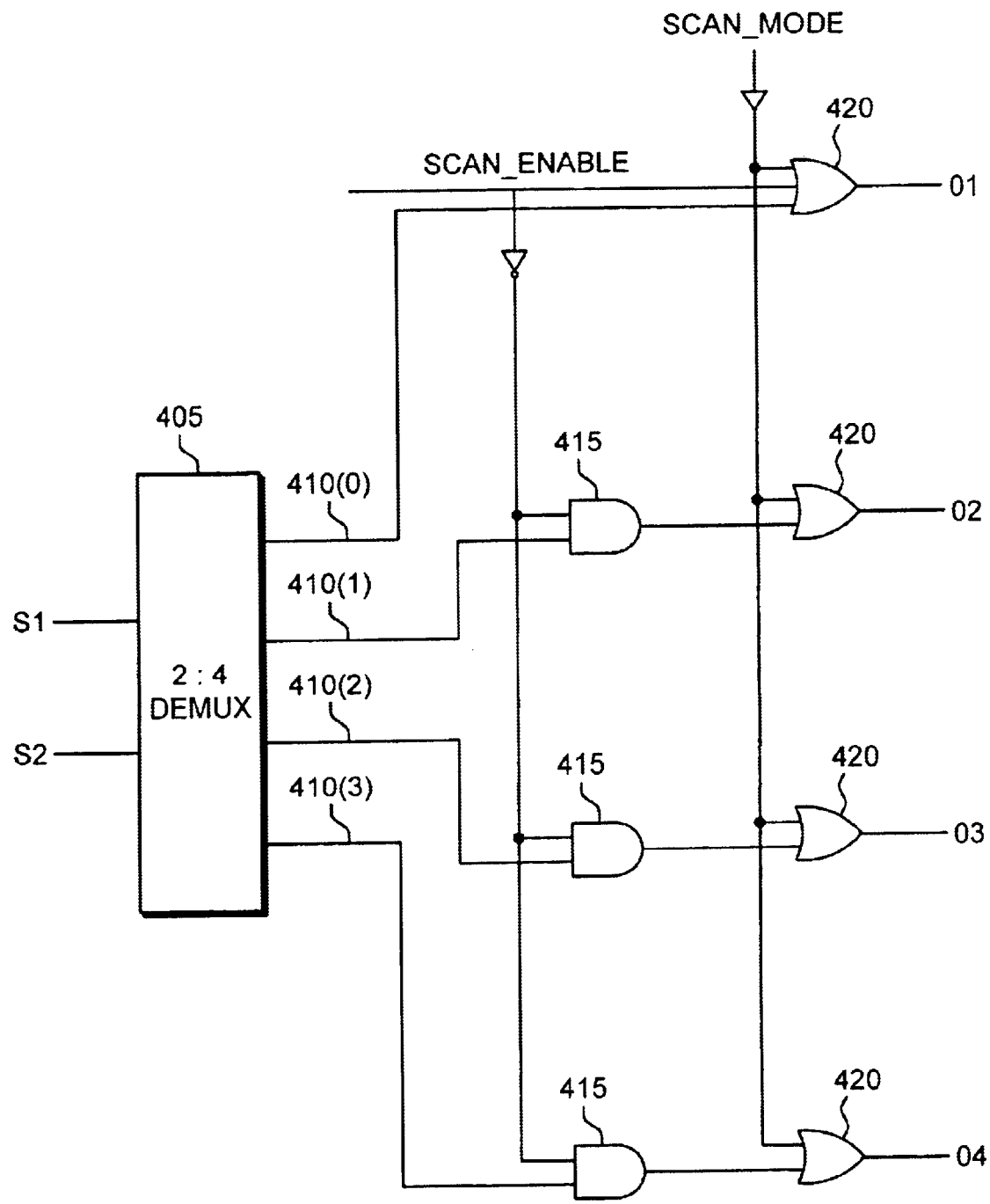
FIG. 4 is a logic diagram of a decoder for disabling tristate driver in accordance with an embodiment of the present invention.

Referring now to FIG. 4, there is illustrated an exemplary logic design for a decoder 325 in accordance with an embodiment of the present invention. The decoder 325 receives inputs S1, S2, scan_enable, and scan_mode. Inputs S1 and S2 are received by a 2:4 demultiplexer 405. The demultiplexer 405 has four outputs 410 that are controlled by the inputs S1 and S2. If S1, S2=0, output 410(0) is set. If S1=0, S2=1, output 410(1) is set. If S1=1, S2=0, output 410(2) is set and if S1=1, and S2=1, output 410(3) is set.

The outputs 410, except 410(0) are each received by a stage of AND gates 415. The AND gates 415 receive the inverse of scan_enable signal. When the scan_enable signal is set, the output of the AND gates 415 is 0. The output of the AND gates 415 are received by OR gates 420. The output of the OR gates 420(0), 420(1), 420(2), and 420(3), are O0, O1, O2, and O3. The OR gates 420 also receive the inverse of scan_mode signal.

Accordingly, when the scan_mode signal is not set, each of the outputs O0, O1, O2, and O3 are "1". When the scan_enable signal is set, and the scan_enable signal is set, the outputs O0, O1, O2, and O3 are 1,0,0, and 0 respectively, where O0 is associated with the default tri-state driver. When the scan_mode signal is set, and the scan_enable signal is not set, the outputs O0, O1, O2, and O3 are determined by the outputs 410 of the multiplexer. As noted above, the outputs 410 of the multiplexer are determined by S1 and S2.

While the invention has been described with reference to certain embodiments, it will be understood by those skilled in the art that various changes may be made and equivalents may be substituted without departing from the scope of the invention. In addition, many modifications may be made to adapt particular situations or materials to the teachings of the intention without departing from its scope. Therefore, the invention is noted limited to the particular embodiment(s) disclosed, but that the invention will include all embodiments falling within the scope of the claims.

What is claimed is:

1. A method for testing a circuit, said method comprising:
   serially shifting a test pattern into at least a portion of the circuit;
   disabling each of a plurality of tristate drivers except a default driver from the plurality of tristate drivers while serially shifting;
   capturing a test response from at least a portion of the circuit; and
   disabling each of the plurality of tristate drivers except a selected one of the plurality of drivers while capturing the test response.

2. The method of claim 1, further comprising:
   receiving a selection indicating the selected one of the plurality of drivers.

3. The method of claim 2, wherein the selection is a function of the test pattern.

4. The method of claim 1, wherein disabling each of the plurality of tristate drivers except the default driver further comprises transmitting a signal with a first logic state to logic controlling the default driver and transmitting a signal with a second logic state to logic controlling each of the plurality of tristate drivers except the default driver.

5. The method of claim 4, wherein the logic controlling each of the tristate drivers receives functional enable signals.

6. The method of claim 4, wherein the circuit has a testing mode of operation and a functional mode of operation, the method further comprising:

transmitting a signal with the first logic state to logic controlling each of the plurality of tristate drivers during the functional mode.

7. The method of claim 6, wherein the functional mode is indicated by receiving a deasserted signal.

8. A system for testing a circuit, said system comprising:

scan line registers for shifting a test pattern into at least a portion of the circuit and capturing a test response from at least a portion of the circuit;

a decoder for disabling each of a plurality of tristate drivers except a default driver from the plurality of tristate drivers while the scan line registers serially shift the test pattern, and disabling each of the plurality of tristate drivers except a selected one of the plurality of drivers while the scan line registers capture the test response.

9. The system of claim 8, wherein the scan line registers provide a selection indicating the selected one of the plurality of drivers to the decoder.

10. The system of claim 9, wherein the selection is a function of the test pattern.

11. The system of claim 8, further comprising:

a plurality of logic circuits, each of the plurality of logic circuits for controlling an associated one of the plurality tristate drivers, the logic circuits disabling the associated one of the plurality of tristate drivers when receiving a signal with a first logic state.

12. The system of claim 11, wherein the logic circuits comprise an input for receiving a functional enable signal.

13. The system of claim 11, wherein the circuit has a testing mode of operation and functional mode of operation, the decoder transmitting a signal with the second logic state to each of the plurality of logic circuits controlling each of the plurality of tristate drivers during the functional mode.

14. The system of claim 13, wherein the decoder comprises an input for receiving a signal indicating the functional mode or the testing mode.

15. A circuit for testing a device under test, said circuit comprising:

scan line registers shifting a test pattern into at least a portion of the device under test and capturing a test response from at least a portion of the circuit;

a decoder connected to the scan line registers, the decoder disabling each of a plurality of tristate drivers except a default driver from the plurality of tristate drivers while the scan line registers serially shift the test pattern, and disabling each of the plurality of tristate drivers except a selected one of the plurality of drivers while the scan line registers capture the test response.

16. The circuit of claim 15, wherein the scan line registers provide a selection indicating the selected one of the plurality of drivers to the decoder.

17. The circuit of claim 16, wherein the selection is a function of the test pattern.

18. The circuit of claim 15, further comprising:

a plurality of logic circuits, each of the plurality of logic circuits connected to an associated one of the plurality tristate drivers, the logic circuits disabling the associated one of the plurality of tristate drivers when receiving a signal with a first logic state.

19. The circuit of claim 18, wherein the logic circuits further comprise an AND gate.

20. The circuit of claim 18, wherein the logic circuits comprise an input receiving a functional enable signal.

21. The circuit of claim 18, wherein the device under test has a testing mode of operation and functional mode of operation, and the decoder transmits a signal with a second logic state to each of the plurality of logic circuits controlling each of the plurality of tristate drivers during the functional mode.

22. The circuit of claim 21, wherein the decoder comprises an input receiving a signal indicating the functional mode or the testing mode.

* * * * *